(12) United States Patent
Hirata (10) Patent No.: US 9,941,130 B2
(45) Date of Patent: *Apr. 10, 2018

(54) THIN PLATE SEPARATING METHOD (71) Applicant: DISCO CORPORATION, Tokyo (JP)

(72) Inventor: Kazuya Hirata, Tokyo (JP)

(73) Assignee: Disco Corporation, Tokyo (JP)

( * ) Notice: Subject to any disclaimer, the term of this patent is extended or adjusted under 35 U.S.C. 154(b) by 58 days.

This patent is subject to a terminal disclaimer.

(21) Appl. No.: 15/098,945

(22) Filed: Apr. 14, 2016

(65) Prior Publication Data

US 2016/0307763 A1 Oct. 20, 2016

(30) Foreign Application Priority Data

Apr. 15, 2015 (JP) ................................. 2015-083642

(51) Int. Cl.
| | |
|---|---|
| *B23K 26/53* | (2014.01) |
| *B23K 26/00* | (2014.01) |
| *B28D 5/00* | (2006.01) |
| *H01L 21/304* | (2006.01) |
| *B26F 3/00* | (2006.01) |
| *H01L 21/268* | (2006.01) |
| *H01L 21/02* | (2006.01) |
| *B24B 7/22* | (2006.01) |
| *B23K 103/00* | (2006.01) |

(Continued)

(52) U.S. Cl.
CPC ........ *H01L 21/304* (2013.01); *B23K 26/0006* (2013.01); *B23K 26/0057* (2013.01); *B23K 26/53* (2015.10); *B24B 7/228* (2013.01); *B26F 3/002* (2013.01); *B28D 5/00* (2013.01); *H01L 21/02005* (2013.01); *H01L 21/268* (2013.01); *B23K 2203/56* (2015.10); *H01L 29/045* (2013.01); *H01L 29/1608* (2013.01); *H01L 29/2003* (2013.01)

(58) Field of Classification Search
CPC ............ B23K 26/0006; B23K 26/0057; B23K 26/53; B23K 2203/56; B28D 5/0011
USPC ......................................... 125/23.01; 451/41
See application file for complete search history.

(56) References Cited

U.S. PATENT DOCUMENTS 5,581,572 A * 12/1996 Delorme ............. H01S 5/06256
372/102
8,148,184 B2 * 4/2012 Koyanagi .......... B23K 26/0057
257/E21.214

(Continued)

FOREIGN PATENT DOCUMENTS

JP 2000-094211 4/2000

*Primary Examiner* — Eileen Morgan
(74) *Attorney, Agent, or Firm* — Greer Burns & Crain Ltd.

(57) ABSTRACT

A thin plate is separated from an SiC substrate having a first surface, an opposite second surface, a c-axis extending from the first surface to the second surface, and a c-plane perpendicular to the c-axis. The thin plate is formed by epitaxial growth on the first surface of the SiC substrate. The plate is separated by a separation start point forming step of setting the focal point of a laser beam near the first surface of the SiC substrate from the second surface, and applying the laser beam to the second surface to form a modified layer parallel to the first surface and cracks extending from the modified layer along the c-plane, thus forming a separation start point. An external force is applied to the SiC substrate to separate the thin plate from the SiC substrate at the separation start point.

5 Claims, 12 Drawing Sheets

(51) Int. Cl.
H01L 29/04 (2006.01)
H01L 29/16 (2006.01)
H01L 29/20 (2006.01)

(56) References Cited

U.S. PATENT DOCUMENTS

| | | | | |
|---|---|---|---|---|
| 8,415,234 B2* | 4/2013 | Abatake | ............ | B23K 26/0057 |
| | | | | 438/460 |
| 2005/0199592 A1* | 9/2005 | Iri | .................... | B23K 26/0057 |
| | | | | 219/121.6 |
| 2009/0117712 A1* | 5/2009 | Sakamoto | .......... | B23K 26/0057 |
| | | | | 438/463 |
| 2011/0195536 A1* | 8/2011 | Koyanagi | .......... | B23K 26/0057 |
| | | | | 438/33 |
| 2011/0195537 A1* | 8/2011 | Koyanagi | .......... | B23K 26/0057 |
| | | | | 438/33 |
| 2012/0289028 A1* | 11/2012 | Abatake | ............ | B23K 26/0057 |
| | | | | 438/463 |
| 2016/0158881 A1* | 6/2016 | Hirata | ............... | B23K 26/0057 |
| | | | | 225/2 |
| 2016/0228984 A1* | 8/2016 | Hirata | ............... | B23K 26/0057 |
| 2016/0293397 A1* | 10/2016 | Hirata | .................... | B28D 1/221 |
| 2016/0354862 A1* | 12/2016 | Hirata | ............... | B23K 26/0057 |
| 2016/0354863 A1* | 12/2016 | Hirata | ............... | B23K 26/0057 |
| 2017/0015017 A1* | 1/2017 | Hirata | .................... | B26F 3/002 |

* cited by examiner

THIN PLATE SEPARATING METHOD

BACKGROUND OF THE INVENTION

Field of the Invention

The present invention relates to a thin plate separating method for separating a thin plate (thin film) from an SiC substrate, the thin plate being formed by epitaxial growth on the SiC substrate.

Description of the Related Art

Various devices such as ICs and LSIs are formed by forming a functional layer on the front side of a wafer formed of silicon or the like and partitioning this functional layer into a plurality of regions along a plurality of crossing division lines. The division lines of the wafer are processed by a processing apparatus such as a cutting apparatus and a laser processing apparatus to thereby divide the wafer into a plurality of individual device chips each corresponding to the devices. The device chips thus obtained are widely used in various electronic equipment such as mobile phones and personal computers.

In general, the wafer on which the devices are to be formed is produced by slicing an ingot with a wire saw. Both sides of the wafer obtained above are polished to a mirror finish (see Japanese Patent Laid-open No. 2000-94221, for example). Further, power devices or optical devices such as LEDs and LDs are formed by forming a functional layer on the front side of a wafer formed of a hexagonal single crystal such as SiC and GaN and partitioning this functional layer in a similar manner. In this case, the wafer is produced by slicing an ingot as one method. Another method of producing the wafer includes the steps of forming a thin plate (thin film) such as an SiC thin plate (thin film) and a GaN thin plate (thin film) on the upper surface (front side) of an SiC substrate by epitaxial growth and next separating the thin plate from the SiC substrate, thereby forming a high-purity wafer.

SUMMARY OF THE INVENTION

However, in separating the thin plate from the SiC substrate, the SiC substrate is cut by using a wire saw. At this time, a part of the SiC substrate is left on the back side of the thin plate. Accordingly, this part of the SiC substrate left on the back side of the thin plate must be removed by polishing to produce the wafer composed of only the thin plate. As a result, a large proportion of the SiC substrate is discarded and the SiC substrate cannot be reused to cause poor economy.

It is therefore an object of the present invention to provide a thin plate separating method which can efficiently separate a thin plate from an SiC substrate, the thin plate being formed by epitaxial growth on the upper surface (front side) of the SiC substrate.

In accordance with an aspect of the present invention, there is provided a thin plate separating method for separating a thin plate from an SiC substrate having a first surface, a second surface opposite to the first surface, a c-axis extending from the first surface to the second surface, and a c-plane perpendicular to the c-axis, the thin plate being formed by epitaxial growth on the first surface of the SiC substrate, the thin plate separating method including a separation start point forming step of setting the focal point of a laser beam having a transmission wavelength to the SiC substrate near the first surface of the SiC substrate from the second surface of the SiC substrate, and next applying the laser beam to the second surface as relatively moving the focal point and the SiC substrate to thereby form a modified layer parallel to the first surface and cracks extending from the modified layer along the c-plane, thus forming a separation start point; and a separating step of applying an external force to the SiC substrate to separate the thin plate from the SiC substrate at the separation start point after performing the separation start point forming step; the separation start point forming step including a modified layer forming step of relatively moving the focal point of the laser beam in a first direction perpendicular to a second direction where the c-axis is inclined by an off angle with respect to a normal to the second surface and the off angle is formed between the second surface and the c-plane, thereby linearly forming the modified layer extending in the first direction, and an indexing step of relatively moving the focal point in the second direction to thereby index the focal point by a predetermined amount.

Preferably, the focal point is set inside the thin plate in the separation start point forming step, and a part of the thin plate is left on the first surface of the SiC substrate by performing the separating step. Alternatively, the focal point is set inside the SiC substrate in the separation start point forming step, and a part of the SiC substrate is left on the back side of the thin plate by performing the separating step.

According to the thin plate separating method of the present invention, a plurality of linear modified layers are formed in the c-plane, and the cracks are formed on both sides of each modified layer so as to propagate along the c-plane. Accordingly, any adjacent ones of the plural modified layers are connected together through the cracks formed therebetween, thereby forming the separation start point, so that the thin plate can be easily separated from the SiC substrate at the separation start point. Furthermore, after separating the thin plate from the SiC substrate, the SiC substrate can be reused to effect economy.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
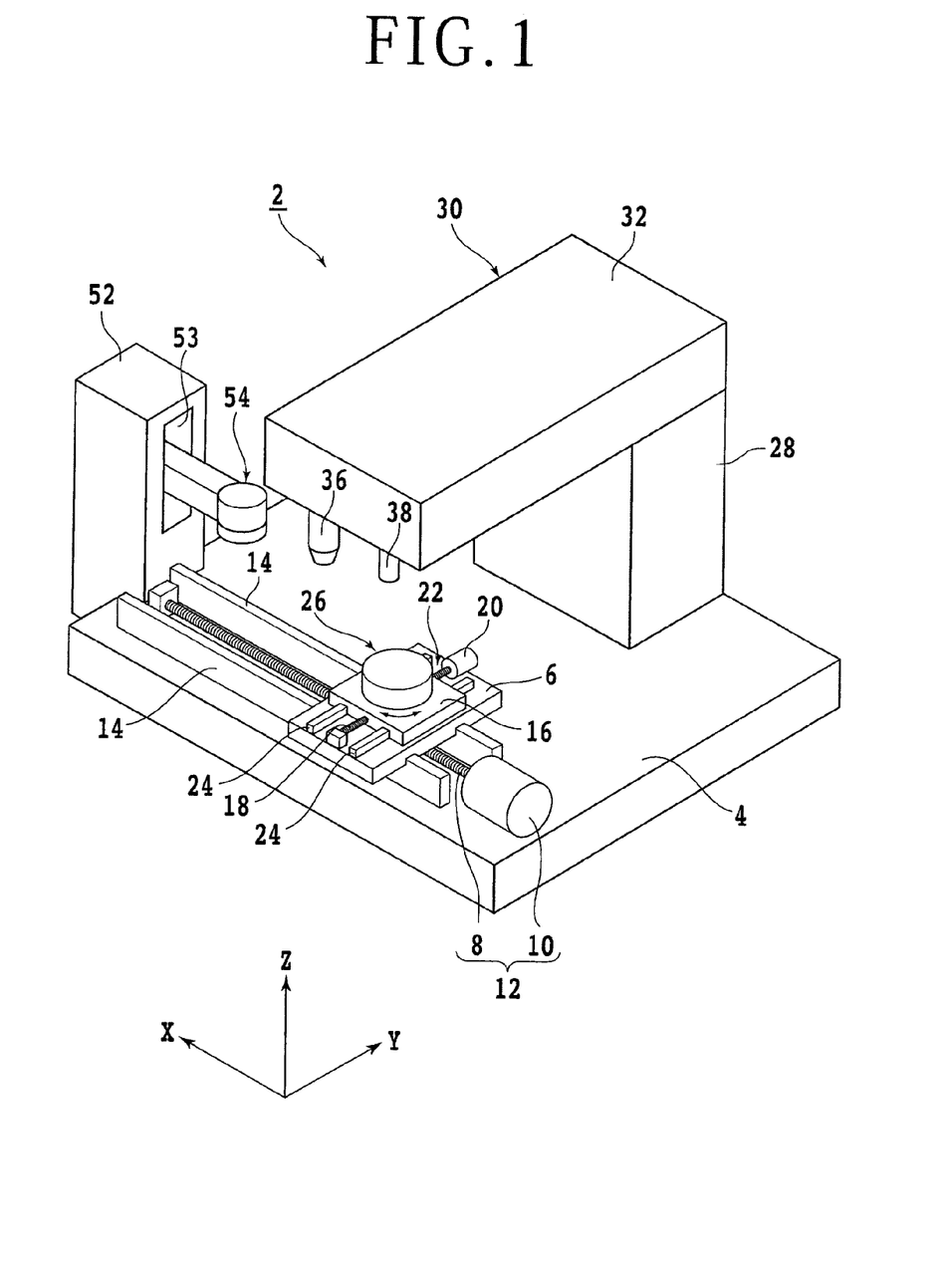
FIG. 1 is a perspective view of a laser processing apparatus suitable for use in performing the thin plate separating method of the present invention.

A preferred embodiment of the present invention will now be described in detail with reference to the drawings. Referring to FIG. 1, there is shown a perspective view of a laser processing apparatus 2 suitable for use in performing the thin plate separating method of the present invention. The laser processing apparatus 2 includes a stationary base 4 and a first slide block 6 mounted on the stationary base 4 so as to be movable in the X direction. The first slide block 6 is moved in a feeding direction, or in the X direction along a pair of guide rails 14 by a feeding mechanism 12 composed of a ball screw 8 and a pulse motor 10.

A second slide block 16 is mounted on the first slide block 6 so as to be movable in the Y direction. The second slide block 16 is moved in an indexing direction, or in the Y direction along a pair of guide rails 24 by an indexing mechanism 22 composed of a ball screw 18 and a pulse motor 20. A support table 26 is mounted on the second slide block 16. The support table 26 is movable in the X direction and the Y direction by the feeding mechanism 12 and the indexing mechanism 22 and also rotatable by a motor stored in the second slide block 16.

A column 28 is provided on the stationary base 4 so as to project upward therefrom. A laser beam applying mechanism (laser beam applying means) 30 is mounted on the column 28. The laser beam applying mechanism 30 is composed of a casing 32, a laser beam generating unit 34 (see FIG. 2) stored in the casing 32, and focusing means (laser head) 36 mounted on the front end of the casing 32. An imaging unit 38 having a microscope and a camera is also mounted on the front end of the casing 32 so as to be aligned with the focusing means 36 in the X direction.

Figure 2:
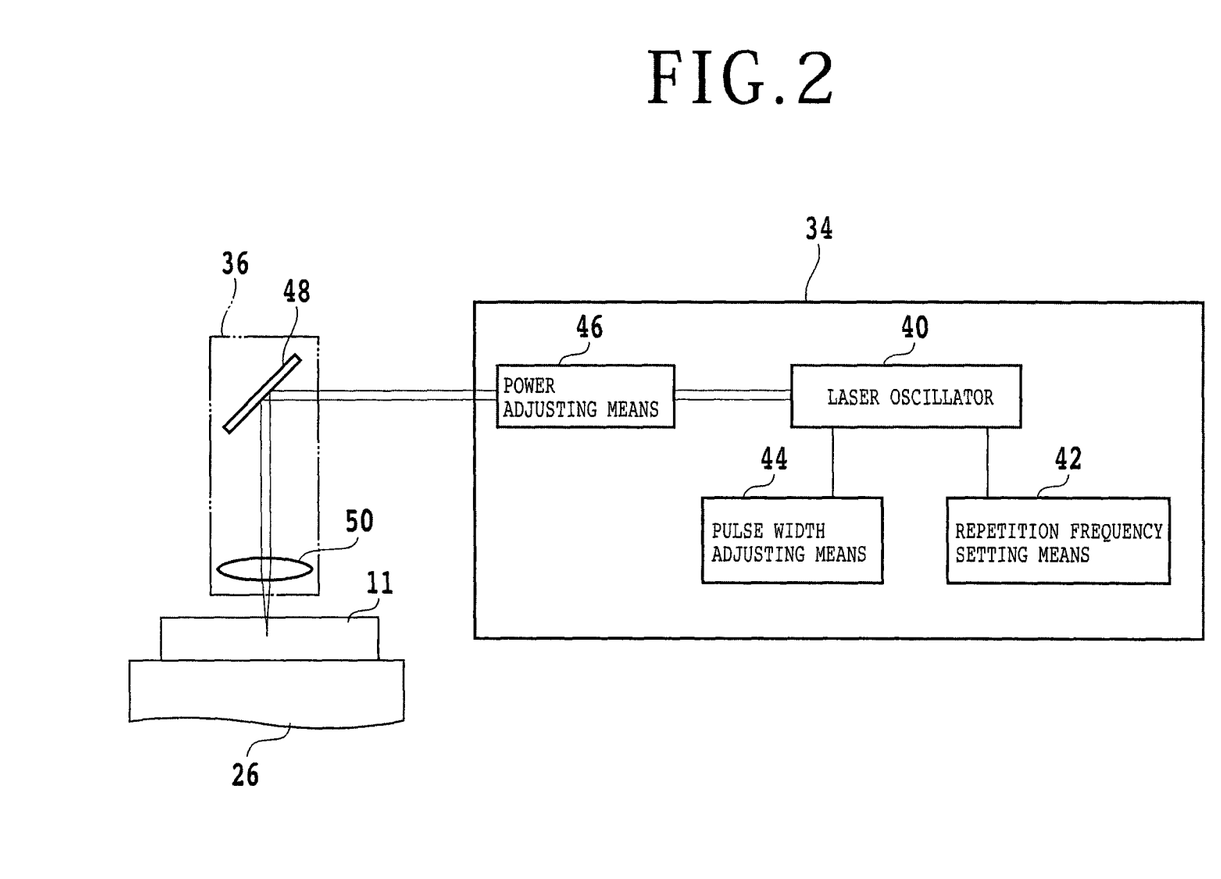
FIG. 2 is a block diagram of a laser beam generating unit.

As shown in FIG. 2, the laser beam generating unit 34 includes a laser oscillator 40 such as YAG laser and YVO4 laser for generating a pulsed laser beam, repetition frequency setting means 42 for setting the repetition frequency of the pulsed laser beam to be generated by the laser oscillator 40, pulse width adjusting means 44 for adjusting the pulse width of the pulsed laser beam to be generated by the laser oscillator 40, and power adjusting means 46 for adjusting the power of the pulsed laser beam generated by the laser oscillator 40. Although especially not shown, the laser oscillator 40 has a Brewster window, so that the laser beam generated from the laser oscillator 40 is a laser beam of linearly polarized light. After the power of the pulsed laser beam is adjusted to a predetermined power by the power adjusting means 46 of the laser beam generating unit 34, the pulsed laser beam is reflected by a mirror 48 included in the focusing means 36 and next focused by a focusing lens 50 included in the focusing means 36. The focusing lens 50 is positioned so that the pulsed laser beam is focused inside an SiC substrate 11 as a workpiece fixed to the support table 26.

Figure 3A:
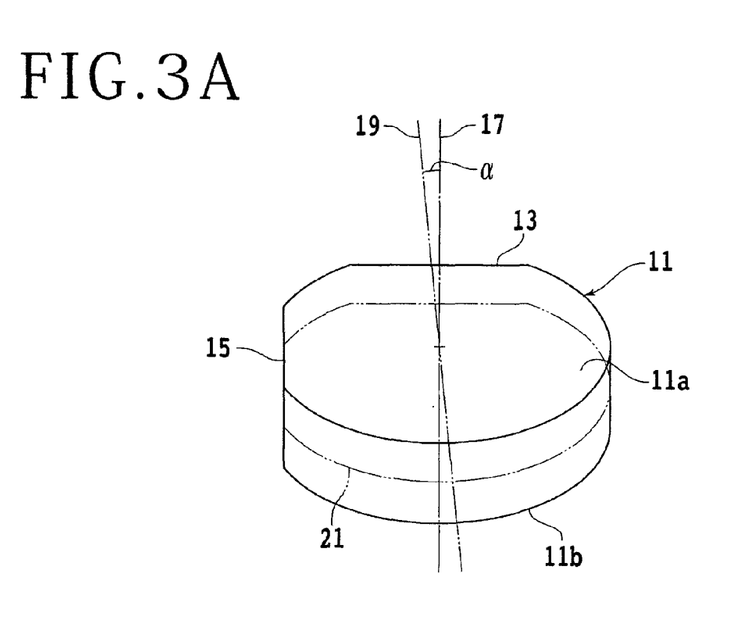
FIG. 3A is a perspective view of an SiC substrate.
Figure 3B:
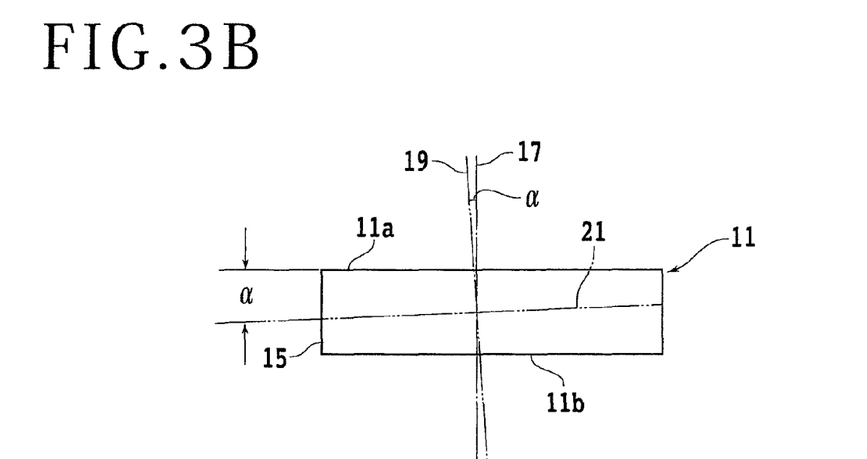
FIG. 3B is an elevational view of the SiC substrate shown in FIG. 3A.

Referring to FIG. 3A, there is shown a perspective view of the SiC substrate 11 as a workpiece to be processed. FIG. 3B is an elevational view of the SiC substrate 11 shown in FIG. 3A. The SiC substrate 11 has a first surface (front side) 11a and a second surface (back side) 11b opposite to the first surface 11a. The front side 11a and the back side 11b of the SiC substrate 11 are preliminarily polished to a mirror finish. The SiC substrate 11 has a first orientation flat 13 and a second orientation flat 15 perpendicular to the first orientation flat 13. The length of the first orientation flat 13 is set longer than the length of the second orientation flat 15.

The SiC substrate 11 has a c-axis 19 inclined by an off angle α toward the second orientation flat 15 with respect to a normal 17 to the front side 11a and also has a c-plane 21 perpendicular to the c-axis 19. The c-plane 21 is inclined by the off angle α with respect to the front side 11a of the SiC substrate 11. In general, in the SiC substrate 11, the direction perpendicular to the direction of extension of the shorter second orientation flat 15 is the direction of inclination of the c-axis. The c-plane 21 is set in the SiC substrate 11 innumerably at the molecular level of the SiC substrate 11. In this preferred embodiment, the off angle α is set to 4°. However, the off angle α is not limited to 4° in the present invention. For example, the off angle α may be freely set in the range of 1° to 6° in manufacturing the SiC substrate 11.

Referring again to FIG. 1, a column 52 is fixed to the left side of the stationary base 4. The column 52 is formed with a vertically elongated opening 53, and a pressing mechanism 54 is vertically movably mounted to the column 52 so as to project from the opening 53.

Figure 4A:
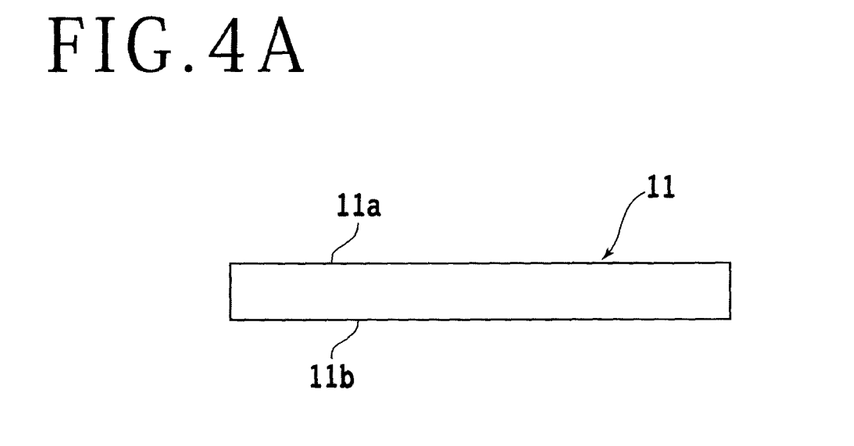
FIG. 4A is an elevational view of an SiC substrate.
Figure 4B:
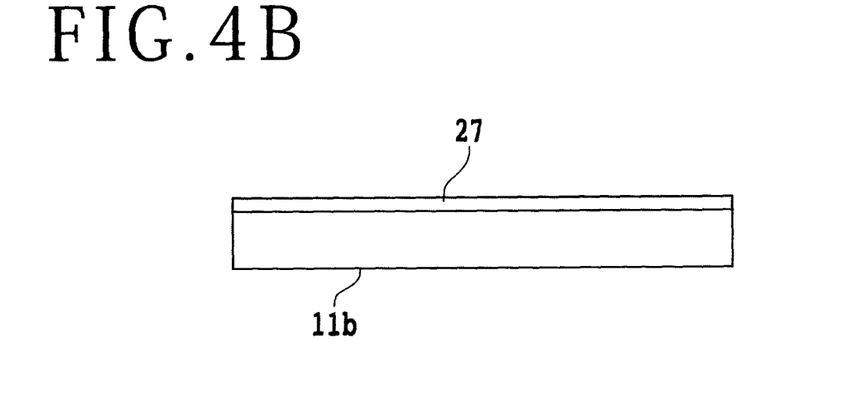
FIG. 4B is a schematic elevational view of an SiC substrate having a thin plate (thin film) formed by epitaxial growth on the upper surface (front side)

Referring to FIG. 4A, there is shown an elevational view of the SiC substrate 11. The SiC substrate 11 has a thickness of about 300 to 1000 μm, for example. The front side 11a and the back side 11b of the SiC substrate 11 are mirror surfaces. As shown in FIG. 4B, a thin plate (thin film) 27 such as an SiC thin plate (thin film) and a GaN thin plate (thin film) is formed by epitaxial growth on the front side 11a of the SiC substrate 11. The thin plate 27 has a thickness of about 200 μm, for example.

The epitaxial growth mentioned above is one of the thin film crystal growing techniques. That is, the epitaxial growth is a crystal growing method such that a crystal as a thin film is grown on a crystal substrate and ordered with the same crystal orientation as that of the crystal substrate. In the case that the material of the thin film is the same as that of the substrate, the epitaxial growth is called homoepitaxy, whereas in the case that the material of the thin film is different from that of the substrate, the epitaxial growth is called heteroepitaxy. Examples of the crystal growing method that can be adopted include molecular beam epitaxy, organometallic vapor-phase epitaxy, and liquid-phase epitaxy. In effecting the epitaxial growth, it is necessary to select the crystals of the substrate and the thin film to be grown on the substrate so that the lattice constant of the crystal of the substrate is almost equal to that of the crystal of the thin film and the thermal expansion coefficient of the substrate must be close to that of the thin film. The c-axis and the c-plane of the thin plate 27 formed by epitaxial growth on the SiC substrate 11 coincide in direction with the c-axis and the c-plane of the SiC substrate 11.

Figure 5:
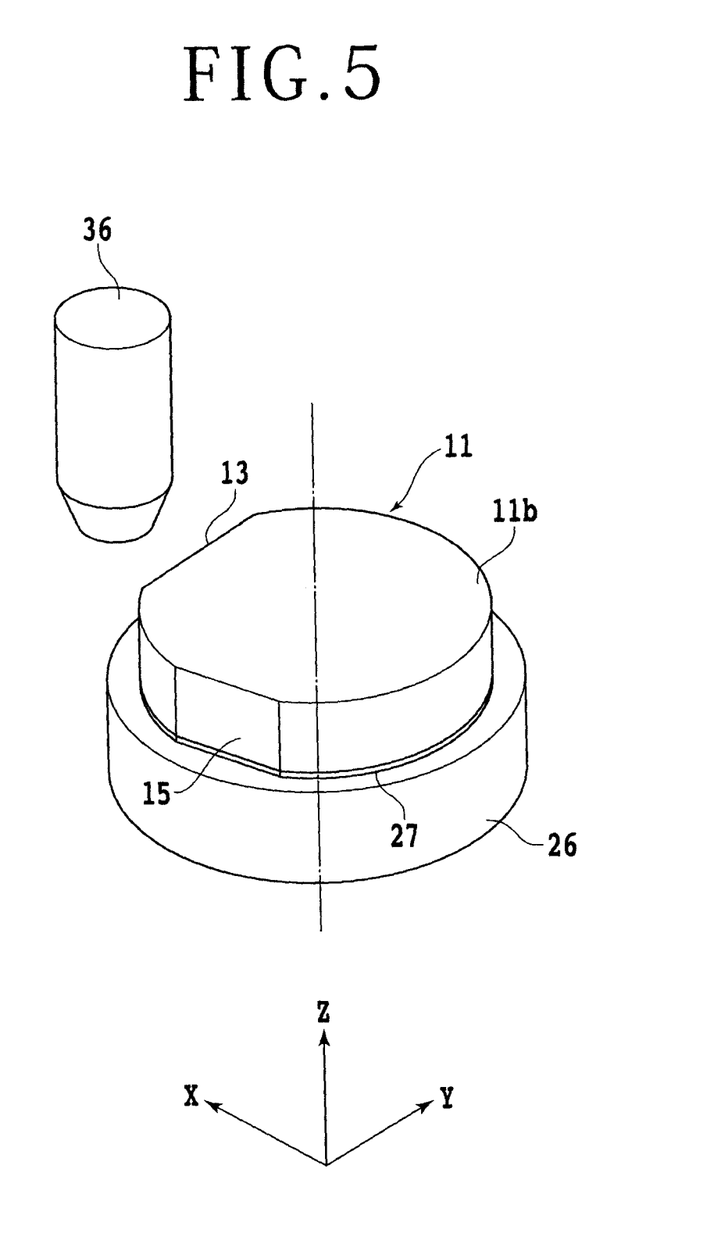
FIG. 5 is a perspective view for illustrating a separation start point forming step.
Figure 6:
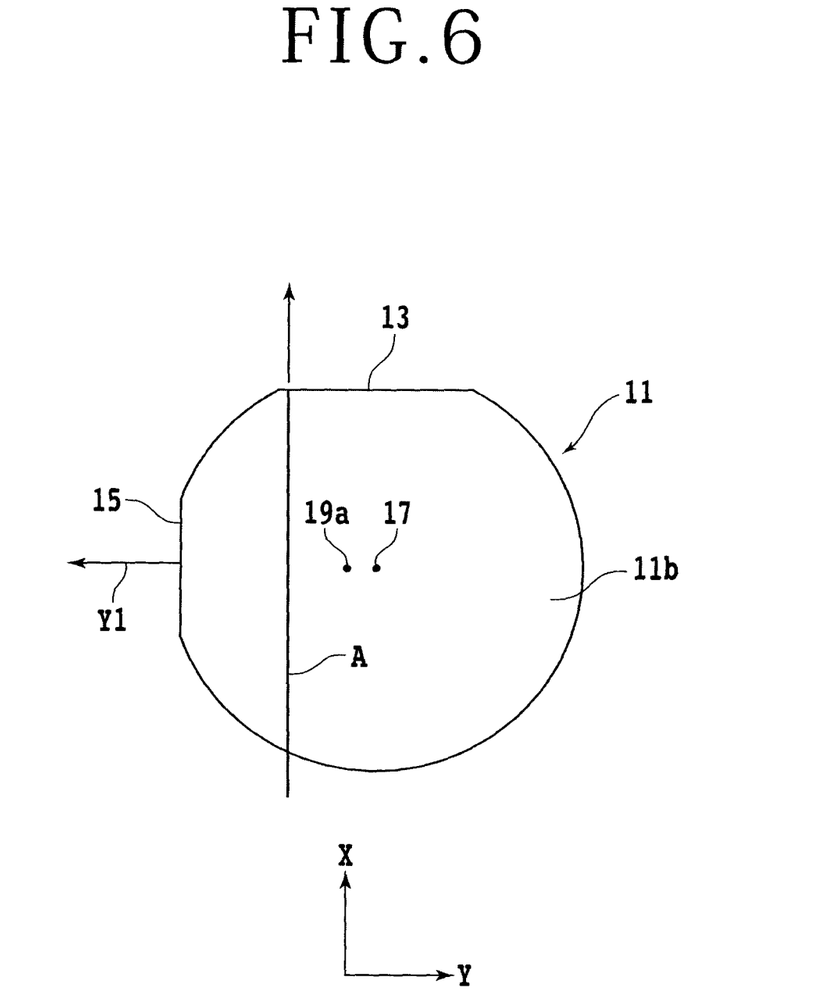
FIG. 6 is a plan view of the SiC substrate shown in FIG. 5.

As shown in FIG. 5, the SiC substrate 11 is fixed to the upper surface of the support table 26 by using a wax or adhesive in the condition where the second orientation flat 15 of the SiC substrate 11 becomes parallel to the X direction and the thin plate 27 formed on the front side 11a of the SiC substrate 11 is oriented downward. In other words, as shown in FIG. 6, the direction of formation of the off angle α is shown by an arrow Y1. That is, the direction of the arrow Y1 is the direction where the intersection 19a between the c-axis 19 and the back side 11b of the SiC substrate 11 is present with respect to the normal 17 to the back side 11b. Further, the direction perpendicular to the direction of the arrow Y1 is shown by an arrow A. Then, the SiC substrate 11 is fixed to the support table 26 in the condition where the direction of the arrow A becomes parallel to the X direction. Accordingly, the laser beam is scanned in the direction of the arrow A perpendicular to the direction of the arrow Y1, or the direction of formation of the off angle α. In other words, the direction of the arrow A perpendicular to the direction of the arrow Y1 where the off angle α is formed is defined as the feeding direction of the support table 26.

In the thin plate separating method of the present invention, it is important that the scanning direction of the laser beam to be applied from the focusing means 36 is set to the direction of the arrow A perpendicular to the direction of the arrow Y1 where the off angle α of the SiC substrate 11 is formed. That is, it was found that by setting the scanning direction of the laser beam to the direction of the arrow A as mentioned above in the thin plate separating method of the present invention, cracks propagating from a modified layer formed inside the SiC substrate 11 by the laser beam extend very long along the c-plane 21.

In performing the thin plate separating method according to this preferred embodiment, a separation start point forming step is performed in such a manner that the focal point of the laser beam having a transmission wavelength (e.g., 1064 nm) to the SiC substrate 11 fixed to the support table 26 is set near the first surface (front side) 11a of the SiC substrate 11, and the laser beam is next applied to the back side 11b of the SiC substrate 11 as relatively moving the focal point and the SiC substrate 11 to thereby form a modified layer 23 parallel to the back side 11b and cracks 25 propagating from the modified layer 23 along the c-plane 21, thus forming a separation start point.

Figure 7:
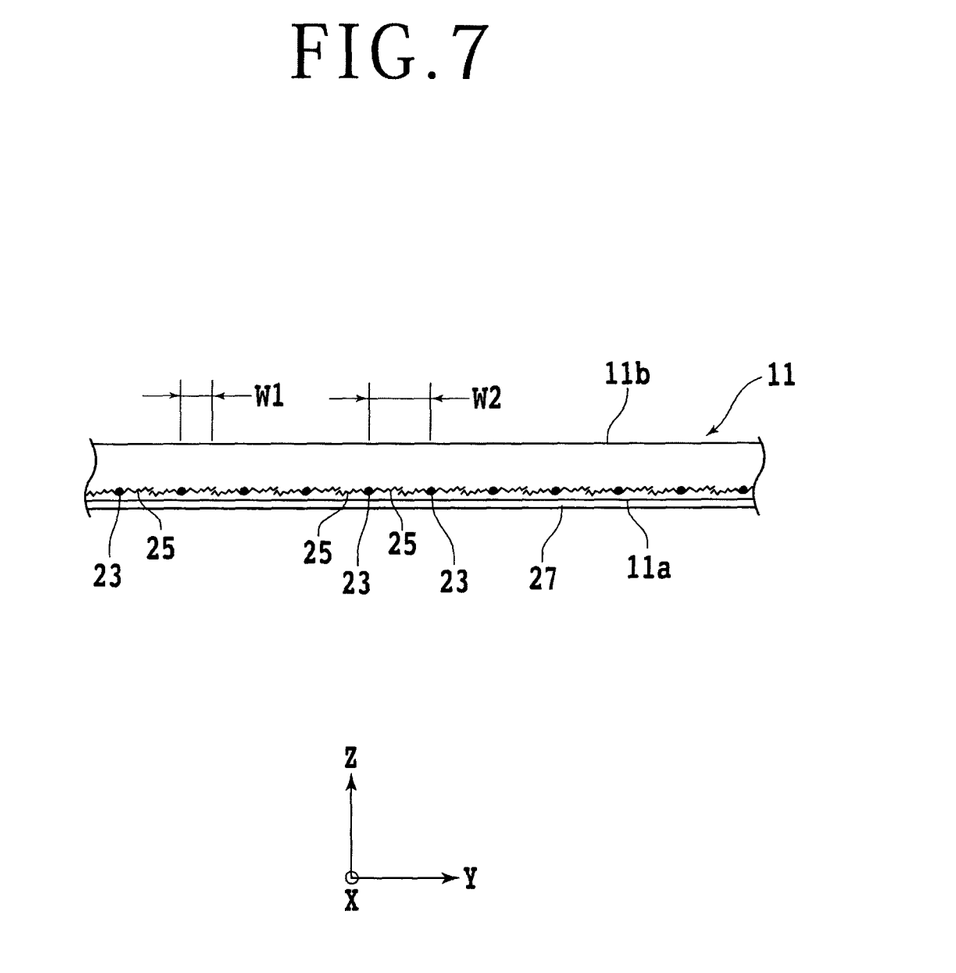
FIG. 7 is a schematic sectional view for illustrating a modified layer forming step.

FIG. 7 shows a first preferred embodiment of this separation start point forming step. In the first preferred embodiment shown in FIG. 7, the focal point of the laser beam is set inside the SiC substrate 11 near the front side 11a thereof to form the modified layer 23 and the cracks 25 propagating from the modified layer 23 along the c-plane 21 inside the SiC substrate 11 near the front side 11a thereof, thus forming the separation start point. Although not shown, a second preferred embodiment of the separation start point forming step may be adopted, wherein the focal point of the laser beam is set inside the thin plate 27 near the front side 11a of the SiC substrate 11 to form the modified layer 23 and the cracks 25 propagating from the modified layer 23 along the c-plane 21 inside the thin plate 27 near the front side 11a of the SiC substrate 11, thus forming the separation start point.

Figure 8:
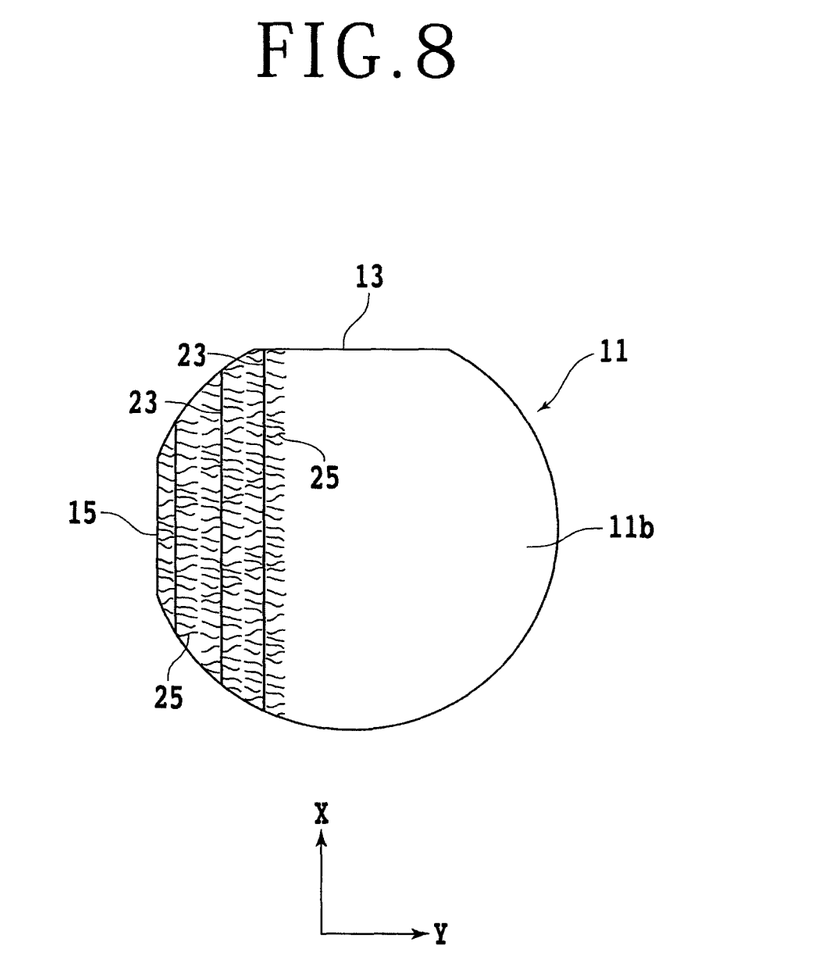
FIG. 8 is a schematic plan view for illustrating the modified layer forming step.

This separation start point forming step includes a modified layer forming step of relatively moving the focal point of the laser beam in the direction of the arrow A perpendicular to the direction of the arrow Y1 where the c-axis 19 is inclined by the off angle α with respect to the normal 17 to the back side 11b and the off angle α is formed between the c-plane 21 and the back side 11b, thereby forming the modified layer 23 inside the SiC substrate 11 and the cracks 25 propagating from the modified layer 23 along the c-plane 21, and also includes an indexing step of relatively moving the focal point in the direction of formation of the off angle α, i.e., in the Y direction to thereby index the focal point by a predetermined amount as shown in FIG. 8.

As shown in FIGS. 7 and 8, the modified layer 23 is linearly formed so as to extend in the X direction, so that the cracks 25 propagate from the modified layer 23 in opposite directions along the c-plane 21. In the thin plate separating method according to this preferred embodiment, the separation start point forming step further includes an index amount setting step of measuring the width of the cracks 25 formed on one side of the modified layer 23 along the c-plane 21 and then setting the index amount of the focal point according to the width measured above. More specifically, letting W1 denote the width of the cracks 25 formed on one side of the modified layer 23 so as to propagate from the modified layer 23 along the c-plane 21, the index amount W2 of the focal point is set in the range of W1 to 2W1 as shown in FIG. 7.

For example, the separation start point forming step is performed under the following laser processing conditions.
Light source: Nd:YAG pulsed laser
Wavelength: 1064 nm
Repetition frequency: 80 kHz
Average power: 3.2 W
Pulse width: 4 ns
Spot diameter: 10 μm
Numerical aperture (NA) of the focusing lens: 0.45
Index amount: 400 μm In the laser processing conditions mentioned above, the width W1 of the cracks 25 propagating from the modified layer 23 along the c-plane 21 in one direction as viewed in FIG. 7 is set to about 250 μm, and the index amount W2 is set to 400 μm.

However, the average power of the laser beam is not limited to 3.2 W. When the average power of the laser beam was set to 2 to 4.5 W, good results were obtained in the preferred embodiment. In the case that the average power was set to 2 W, the width W1 of the cracks 25 was about 100 μm. In the case that the average power was set to 4.5 W, the width W1 of the cracks 25 was about 350 μm. In the case that the average power is less than 2 W or greater than 4.5 W, the modified layer 23 cannot be well formed inside the SiC substrate 11. Accordingly, the average power of the laser beam to be applied is preferably set in the range of 2 to 4.5 W. For example, the average power of the laser beam to be applied to the SiC substrate 11 was set to 3.2 W in this preferred embodiment.

In this manner, the focal point of the laser beam is sequentially indexed by the predetermined amount in the Y direction as shown in FIGS. 7 and 8, to form a plurality of modified layers 23 and the cracks 25 extending from each modified layer 23 along the c-plane 21 near the front side 11a in the whole area of the SiC substrate 11. Thereafter, a separating step is performed in such a manner that an external force is applied to the SiC substrate 11 to thereby separate the thin plate 27 from the SiC substrate 11 at the separation start point composed of the modified layers 23 and the cracks 25.

Figure 9A:
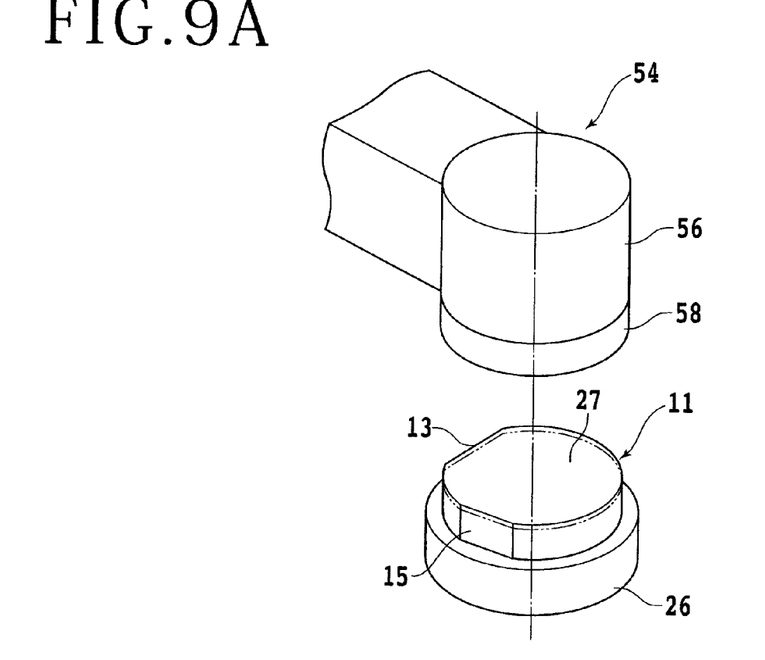
FIGS. 9A and 9B are perspective views for illustrating a separating step.
Figure 9B:
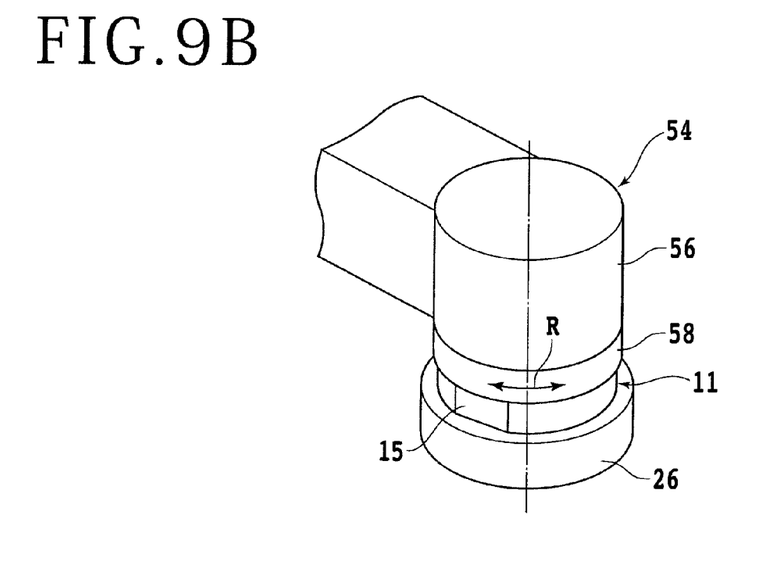

This separating step is performed by using the pressing mechanism 54 shown in FIG. 1. The configuration of the pressing mechanism 54 is shown in FIGS. 9A and 9B. The pressing mechanism 54 includes a head 56 vertically movable by a moving mechanism (not shown) incorporated in the column 52 shown in FIG. 1 and a pressing member 58 rotatable in the direction shown by an arrow R in FIG. 9B with respect to the head 56. As shown in FIG. 9A, the pressing mechanism 54 is relatively positioned above the SiC substrate 11 fixed to the support table 26 in the condition where the thin plate 27 formed on the front side 11a of the SiC substrate 11 is oriented upward. Thereafter, as shown in FIG. 9B, the head 56 is lowered until the pressing member 58 comes into pressure contact with the thin plate 27 formed on the SiC substrate 11.

Figure 10:
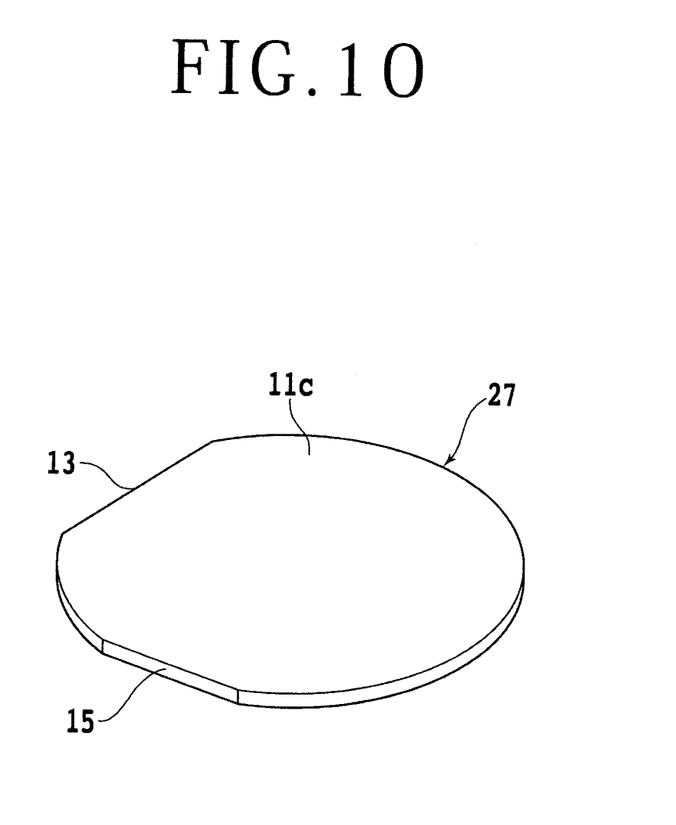
FIG. 10 is a perspective view of a thin plate separated from the SiC substrate.

In the condition where the pressing member 58 is in pressure contact with the thin plate 27 formed on the SiC substrate 11, the pressing member 58 is rotated in the direction of the arrow R to thereby generate a torsional stress in the SiC substrate 11. As a result, the SiC substrate 11 is broken at the separation start point where the modified layers 23 and the cracks 25 are formed. Accordingly, the thin plate 27 shown in FIG. 10 can be separated from the SiC substrate 11. As shown in FIG. 10, a part 11c of the SiC substrate 11 is left on the back side (separation surface) of the thin plate 27 separated from the SiC substrate 11. Accordingly, the thin plate separating method according to this preferred embodiment further includes a grinding step of grinding the back side of the thin plate 27 to remove the part 11c of the SiC substrate 11 left on the back side of the thin plate 27.

Figure 11:
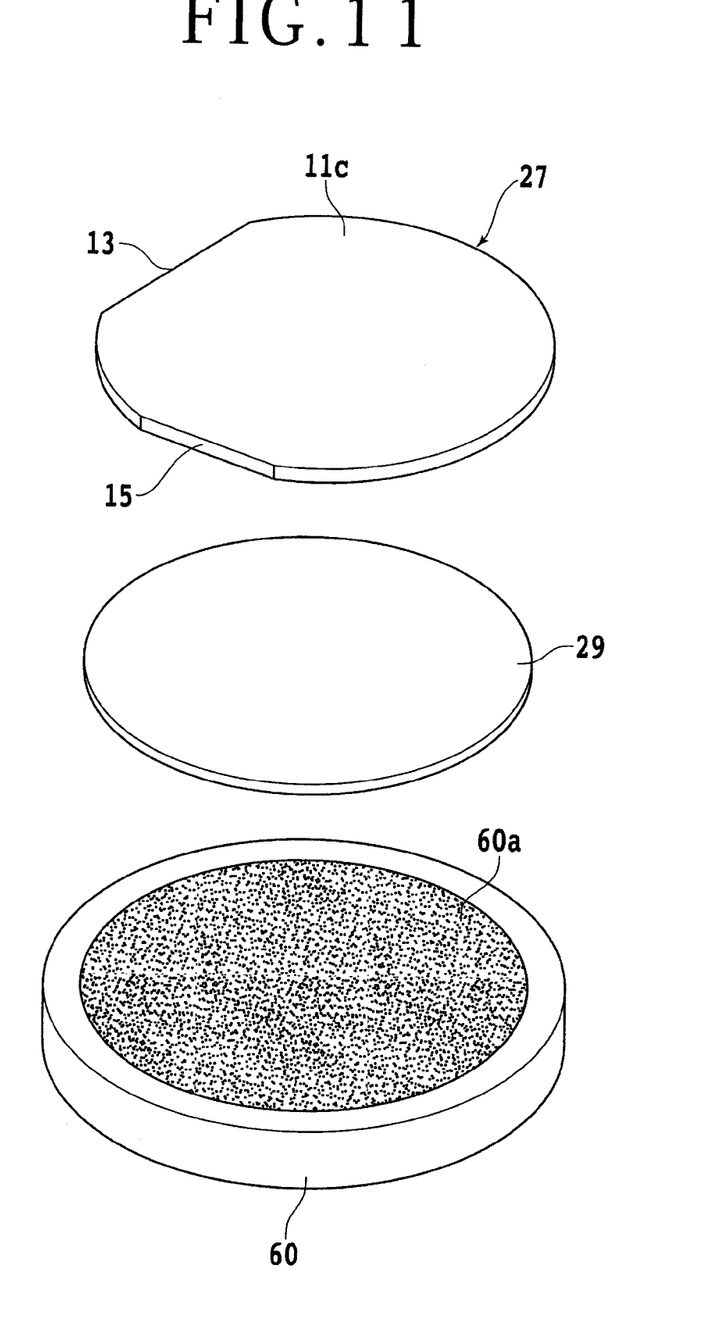
FIG. 11 is a perspective view for illustrating a holding step of holding the thin plate through a substrate on a chuck table included in a grinding apparatus.
Figure 12:
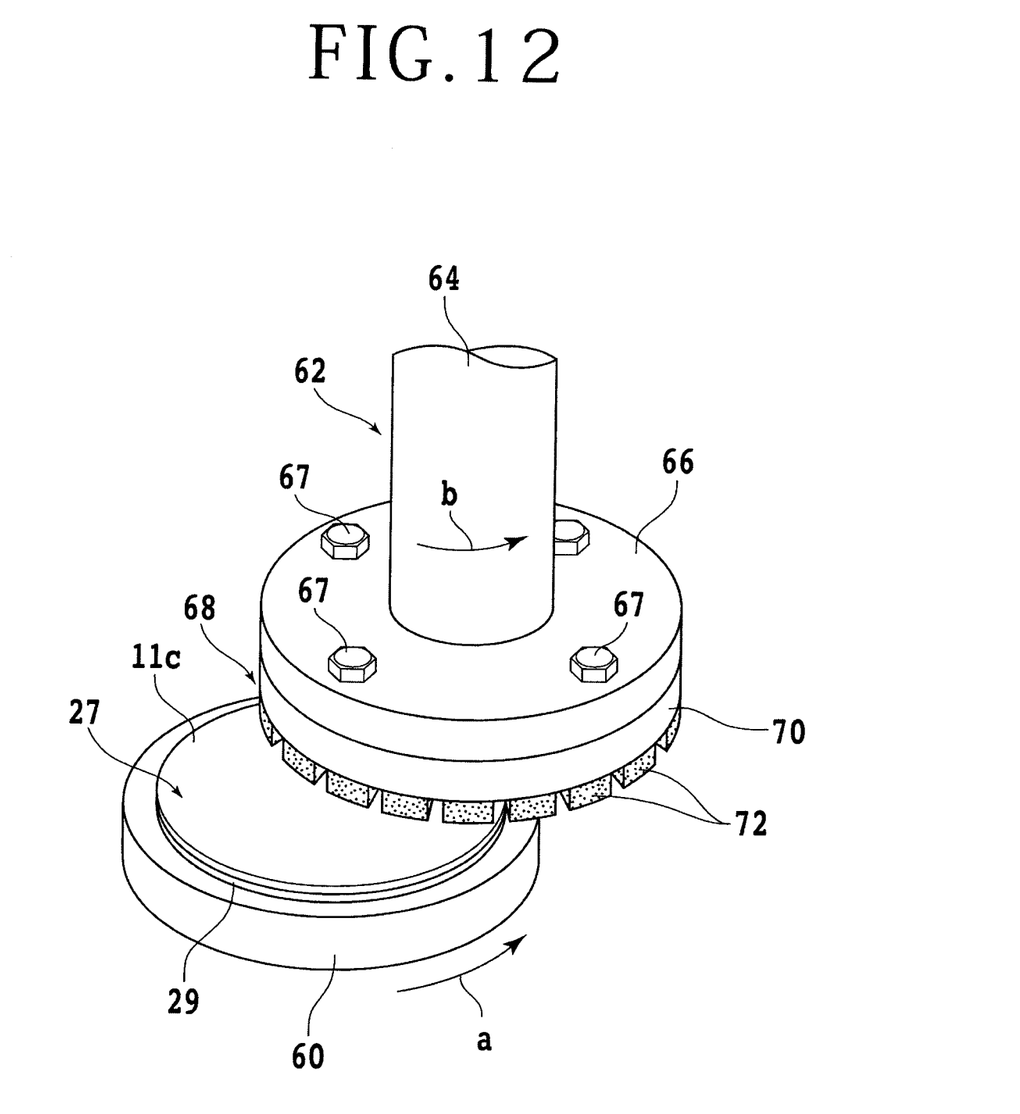
FIG. 12 is a perspective view for illustrating a grinding step.

This grinding step is shown in FIGS. 11 and 12. As shown in FIG. 11, a holding step is first performed in the following manner. The thin plate 27 is fixed to a substrate 29 by using a wax or adhesive in the condition where the part 11c of the SiC substrate 11 left on the back side of the thin plate 27 is exposed. Thereafter, the thin plate 27 is held under suction through the substrate 29 on a holding surface 60a of a chuck table 60 included in a grinding apparatus. After performing this holding step, a grinding unit 62 shown in FIG. 12 is used to grind the back side of the thin plate 27, thereby removing the part 11c of the SiC substrate 11 left on the back side of the thin plate 27.

As shown in FIG. 12, the grinding unit 62 includes a spindle 64, a wheel mount 66 fixed to the lower end of the spindle 64, and a grinding wheel 68 detachably mounted on the lower surface of the wheel mount 66 by means of plural screws 67. The grinding wheel 68 is composed of a wheel base 70 and a plurality of abrasive members 72 fixed to the free end (lower end) of the wheel base 70 so as to be arranged annularly.

In the grinding step, the chuck table 60 is rotated at 300 rpm, for example, in the direction shown by an arrow a, and the grinding wheel 68 is also rotated at 6000 rpm, for example, in the direction shown by an arrow b. Further, a grinding unit feeding mechanism (not shown) is driven to lower the grinding unit 62 until the abrasive members 72 of the grinding wheel 68 come into contact with the part 11c of the SiC substrate 11 left on the back side of the thin plate 27.

Thereafter, the grinding wheel 68 is fed at a predetermined feed speed (e.g., 0.1 μm/second) to thereby remove the part 11c of the SiC substrate 11 left on the back side of the thin plate 27. As a result, a high-purity SiC wafer formed by epitaxial growth can be obtained.

In the case that the focal point of the laser beam is set inside the thin plate 27 according to the second preferred embodiment of the separation start point forming step, a part of the thin plate 27 is left on the front side 11a (separation surface) of the SiC substrate 11 in the separating step. Accordingly, in this case, the part of the thin plate 27 left on the front side 11a of the SiC substrate 11 is removed by performing the grinding step. In the case of this second preferred embodiment, the original thickness of the SiC substrate 11 can be maintained, so that there is a merit that the SiC substrate 11 can be reused unlimitedly many times. In the case of adopting the first preferred embodiment of the separation start point forming step, the thickness of the SiC substrate 11 is gradually reduced in the grinding step, but the SiC substrate 11 can be reused limitedly plural times.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A thin plate separating method for separating a thin plate from an SiC substrate having a first surface, a second surface opposite to the first surface, a c-axis extending from the first surface to the second surface, and a c-plane perpendicular to the c-axis, the thin plate being formed by epitaxial growth on the first surface of the SiC substrate, the thin plate separating method comprising:

a separation start point forming step of setting the focal point of a laser beam having a transmission wavelength to the SiC substrate near the first surface of the SiC substrate from the second surface of the SiC substrate, and next applying the laser beam to the second surface as relatively moving the focal point and the SiC substrate to thereby form a modified layer parallel to the first surface and cracks extending from the modified layer along the c-plane, thus forming a separation start point; and a separating step of applying an external force to the SiC substrate to separate the thin plate from the SiC substrate at the separation start point after performing the separation start point forming step;

the separation start point forming step including a modified layer forming step of relatively moving the focal point of the laser beam in a first direction perpendicular to a second direction where the c-axis is inclined by an off angle with respect to a normal to the second surface and the off angle is formed between the second surface and the c-plane, thereby linearly forming the modified layer extending in the first direction, and an indexing step of relatively moving the focal point in the second direction to thereby index the focal point by a predetermined amount.

2. The thin plate separating method according to claim 1, wherein the focal point is set inside the thin plate in the separation start point forming step, and a part of the thin plate is left on the first surface of the SiC substrate by performing the separating step.

3. The thin plate separating method according to claim 1, wherein the focal point is set inside the SiC substrate in the separation start point forming step, and a part of the SiC substrate is left on the back side of the thin plate by performing the separating step.

4. The thin plate separating method according to claim 2, further comprising a grinding step of grinding the first surface of the SiC substrate to remove the part of the thin plate left on the first surface of the SiC substrate after performing the separating step.

5. The thin plate separating method according to claim 3, further comprising a grinding step of grinding the back side of the thin plate to remove the part of the SiC substrate left on the back side of the thin plate after performing the separating step.

* * * * *